United States Patent [19]

Nozaki et al.

[11] Patent Number: 4,511,997
[45] Date of Patent: Apr. 16, 1985

[54] SEMICONDUCTOR MEMORY DEVICE

[75] Inventors: Shigeki Nozaki, Kawasaki; Yoshihiro Takemae, Tokyo; Tomio Nakano, Kawasaki, all of Japan

[73] Assignee: Fujitsu Limited, Kawasaki, Japan

[21] Appl. No.: 439,507

[22] Filed: Nov. 5, 1982

[30] Foreign Application Priority Data

Nov. 5, 1981 [JP] Japan .................. 56-177477

[51] Int. Cl.³ .............................................. G11C 11/40
[52] U.S. Cl. ...................................... 365/189; 365/230
[58] Field of Search .............. 365/189, 190, 207, 210, 365/230

[56] References Cited

U.S. PATENT DOCUMENTS 3,402,398  9/1968  Koerner et al. ............ 365/189
4,330,852  5/1982  Redwine et al. ........... 365/189

Primary Examiner—Terrell W. Fears
Attorney, Agent, or Firm—Staas & Halsey

[57] ABSTRACT

A metal-insulator semiconductor dynamic memory device including sense amplifiers arrayed on a semiconductor substrate and divided into a plurality of sense amplifier groups. Column decoders are provided, one decoder for each sense amplifier group, each sense amplifier group being selected by the column decoder. One or more control signal lines for simultaneously selecting the output signals of at least two sense amplifiers in the sense amplifier group selected by the column decoder, a plurality of data buses for transferring the output signals of at least two sense amplifiers selected by one or more control signal lines, are included in the memory device. All of the sense amplifiers have the control signal lines and the data buses in common.

14 Claims, 7 Drawing Figures

| Fig. 1A | Fig. 1B |

| Fig. 3A | Fig. 3B |

SEMICONDUCTOR MEMORY DEVICE

BACKGROUND OF THE INVENTION

(1) Field of the Invention

The present invention relates to a semiconductor memory device. More particularly, it relates to a metal-insulator semiconductor (MIS) dynamic memory device in which a plurality of sense amplifiers in a sense amplifier group are selected by a single decoder circuit, and, consequently, the number of decoder circuits is decreased and the degree of integration of the semiconductor memory device is increased.

(2) Description of the Prior Art

To increase the degree of integration of a semiconductor memory device, it is necessary to effectively use the chip area of the integrated circuit of the semiconductor memory device. In an attempt to do this, a recent MIS dynamic memory device adopts a system in which two sense amplifiers are selected by one decoder circuit instead of using a system in which one decoder circuit selects one sense amplifier.

However, even in such a memory device using a system in which two sense amplifiers are selected by a single decoder circuit, the area occupied by the decoder circuits on the semiconductor substrate becomes relatively large when the memory capacity is large, thereby making it difficult to further increase the degree of integration of the semiconductor memory device.

SUMMARY OF THE INVENTION

An object of the present invention is to decrease the area occupied by the decoder circuits on a semiconductor substrate of a semiconductor memory device and to increase the degree of integration thereof.

According to the present invention, there is provided a semiconductor memory device including a plurality of sense amplifiers which are arrayed on a semiconductor substrate, each sense amplifier being connected to a pair of bit lines, characterized in that the plurality of sense amplifiers are divided into a plurality of sense amplifier groups, each group including a plurality of sense amplifiers, the semiconductor memory device further including: column decoders, one column decoder being provided for one sense amplifier group, the group being selected by the column decoder; one or more control signal lines for simultaneously selecting the output signals of at least two sense amplifiers in the sense amplifier group selected by one column decoder; and a plurality of data buses for transferring the output signals of at least two sense amplifiers selected by one or more control signal lines, all of the sense amplifiers having the control signal lines and the data buses in common.

DESCRIPTION OF THE PREFERRED EMBODIMENTS

Figures 1, 1A:
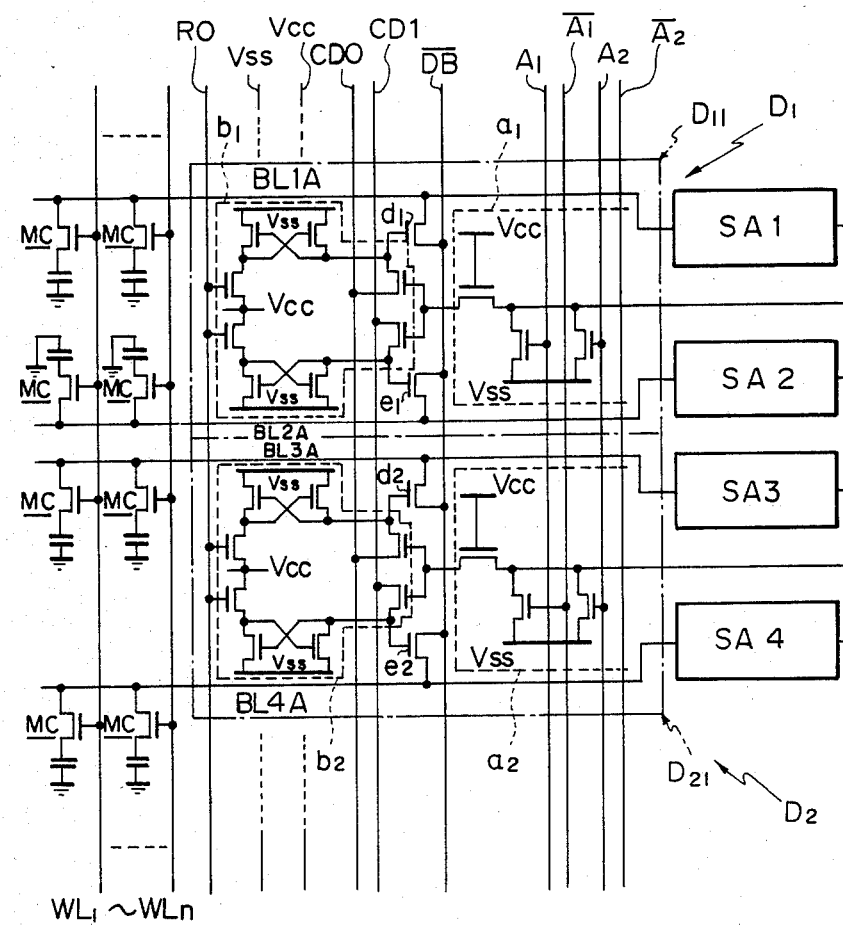
FIG. 1 which is comprised of FIGS. 1A and 1B is a block circuit diagram of a structure of a conventional MIS dynamic memory device.
Figure 1B:
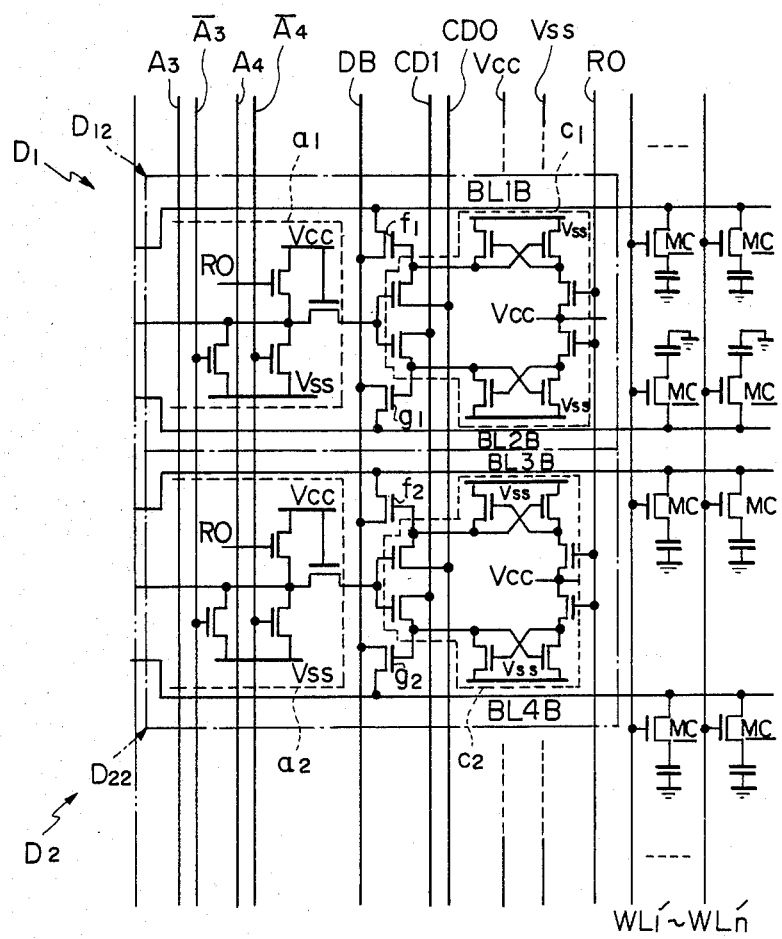

FIG. 1 is a conventional semiconductor memory device in which one of two sense amplifiers is selected by a column decoder. In FIG. 1, SA1 through SA4 are sense amplifiers to which bit lines BL1A and BL1B through BL4A and BL4B are connected, respectively. WL1 through WLn and WL1' through WLn' are word lines, and between each of the word lines and each of the bit lines BL1A, BL1B, BL2A, BL2B, ..., BL4A, BL4B, a memory cell MC consisting of a MIS transistor and a capacitor, is connected. D1 and D2 are column decoders which select one of the sense amplifiers SA1 and SA2 and one of the sense amplifiers SA3 and SA4, respectively. The column decoder D1 comprises two separate portions D11 and D12, and the column decoder D2 comprises two separate portions D21 and D22. The portion D11 of the column decoder D1 and the portion D21 of the column decoder D2 are disposed on one side of the sense amplifiers and the portion D12 of the column decoder D1 and the portion D22 of the column decoder D2 are disposed on the other side of the sense amplifiers SA1, SA2, SA3, and SA4. To these decoders D1 and D2, column address lines A1, $\overline{A1}$, A2, $\overline{A2}$, A3, $\overline{A3}$, and column-selecting signals CD0 and CD1 are connected. The column-selecting signals CD0 and $\overline{CD1}$ are activated by column address signals A0 and $\overline{A0}$, respectively, which are not shown in FIG. 1. DB and $\overline{DB}$ are data buses for transferring readout or write in data. R0 is a reset signal line, and Vcc and Vss are power supply lines.

The column decoder D1 comprises a decoding portion a1 divided into two circuit sections, one of the circuit sections being disposed in the portion D11 and the other circuit section being disposed in the portion D12, and a clamping portion b1 and a clamping portion c1 disposed in the portion D11 and the portion D12, respectively. The column decoder D2 comprises a decoding portion a2 divided into two circuit sections, one of the circuit sections being disposed in the portion D21 and the other circuit section being disposed in the portion D22, and a clamping portion b2 and a clamping portion c2 disposed in the portion D11 and the portion D12, respectively.

In the circuit of FIG. 1, when the output signal of the decoding portion a1 of the column decoder D1 is high, i.e., when the column decoder D1 is selected by column address signals supplied thereto, transfer gate transistors d1 and f1 or transfer gate transistors e1 and g1 are turned on if the column-selecting signal CD0 or CD1 is high. If the column-selecting signal CD0 if high, the transfer gate transistors d1 and f1 are turned on and the bit lines BL1A and BL1B are connected to the data buses $\overline{DB}$ and DB, respectively. Thereby the sense amplifier SA1 is selected. If the column-selecting signal CD1 is high, the transfer gate transistors e1 and g1 are turned on and the bit lines BL2A and BL2B are connected to the data buses $\overline{DB}$ and DB, respectively. Thereby, the sense amplifier SA2 is selected.

When the output signal of the decoding portion a2 of the column decoder D2 is high, i.e., when the column decoder D2 is selected, the sense amplifier SA3 or SA4 is selected if the column-selecting signal CD0 or CD1 is high, in a manner similar to the case of the column decoder D1.

However, in the above-mentioned conventional memory device, since each column decoder selects only one of two sense amplifiers, it is necessary to use a relatively large number of column decoders when the memory capacity is large, thereby making it difficult to further increase the degree of integration of the semiconductor memory device.

According to the present invention, it is possible to solve the problems of the conventional memory device. With reference to the attached drawings, the embodiments of the present invention are now explained.

Figure 2:
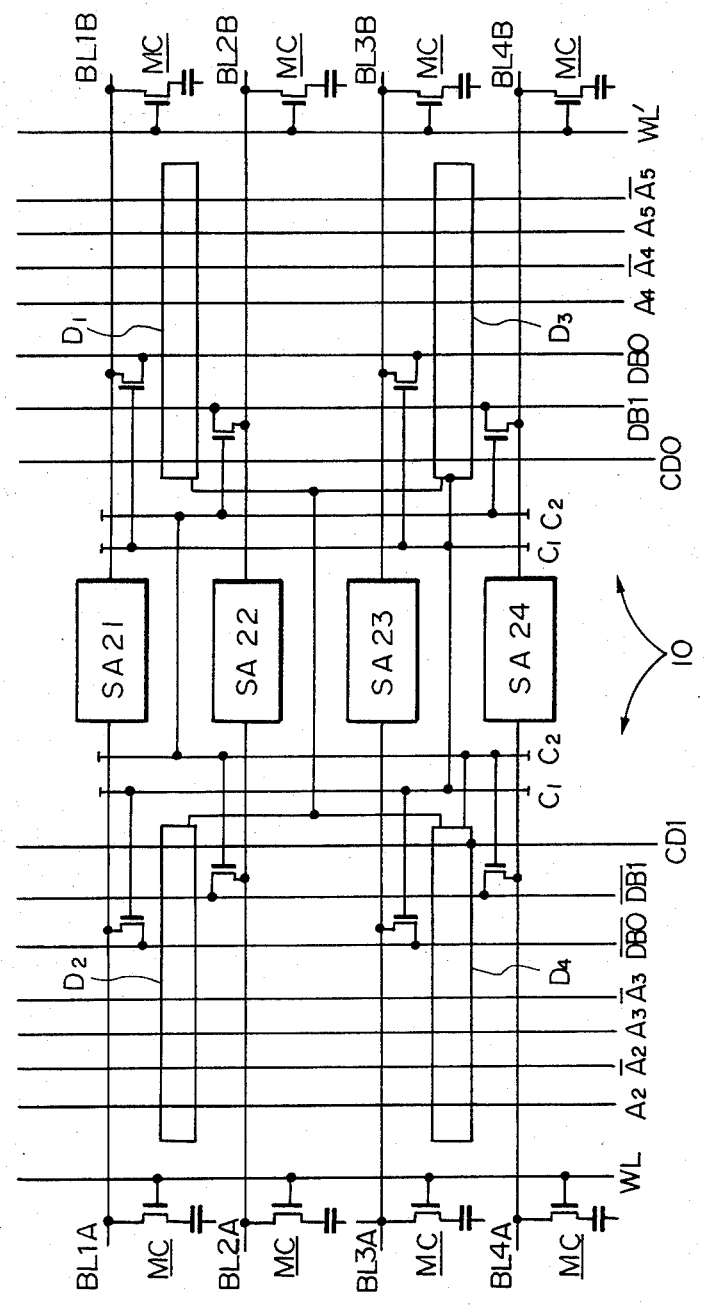
FIG. 2 is a schematic block circuit diagram of a layout of sense amplifiers and column decoders in a semiconductor memory device according to the present invention.

FIG. 2 is a schematic layout of the sense amplifiers, column decoders, etc. in a MIS dynamic memory device according to the present invention. In the figure, SA21, SA22, SA23, and SA24, are sense amplifiers. To either side of the sense amplifiers SA21, SA22, SA23, and SA24, bit lines BL1A and BL1B, BL2A and BL2B, BL3A and BL3B, and BL4A and BL4B are connected, respectively. Reference numeral 10 designates a column decoder which selects the sense amplifiers SA21, SA22, SA23, and SA24. The column decoder 10 comprises four circuit blocks D1, D2, D3, and D4, the circuit blocks D1 and D3 are disposed on one side of the sense amplifier, i.e., the right side, and the circuit blocks D2 and D4 being disposed on the other side, i.e., the left side, of the arrayed sense amplifiers SA21 through SA24. The column address lines A2, $\overline{A2}$, A3, $\overline{A3}$, A4, $\overline{A4}$, A5, $\overline{A5}$, and column-selecting signals CD0 and CD1 are connected to the column decoder 10. The column-selecting signals CD0 and CD1 are activated by column address signals A0 and $\overline{A0}$, respectively, which are not shown in FIG. 2. In the description below, A2 and $\overline{A2}$ through A5 and $\overline{A5}$ designate the column address lines and the column address signals.

In FIG. 2, C1 and C2 are common internal lines disposed on both sides of the arrayed sense amplifiers SA21, SA22, SA23, SA24, . . . parallel thereto. The common internal lines C1 and C2 deliver control signals to gate elements for connecting the bit lines and data buses.

DB0, DB1, $\overline{DB0}$, and $\overline{DB1}$ are data buses which transfer data on the bit lines, and the data is read out with the aid of the sense amplifiers, to a readout circuit (not shown in FIG. 2). WL and WL' are word lines, and between each of the word lines WL and W' and each of the bit lines BL1A, BL1B, BL2A, BL2B, . . . , BL4A, BL4B, a memory cell MC comprising a MIS transistor and a capacitor is connected. Each of the word lines WL and WL' is selected and activated by a row decoder circuit (not shown in FIG. 2).

Figures 3, 3A:
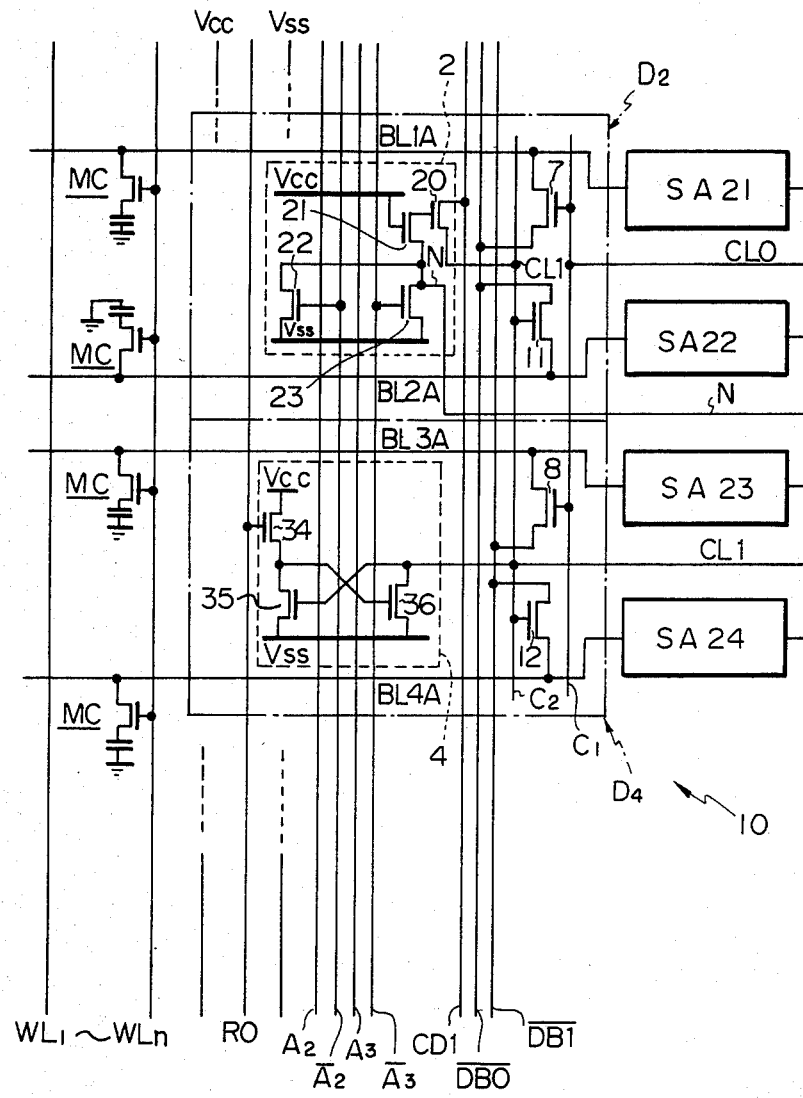
FIG. 3 which is comprised of FIGS. 3A and 3B is a block circuit diagram of a circuit of the semiconductor memory device of FIG. 2.
Figure 3B:
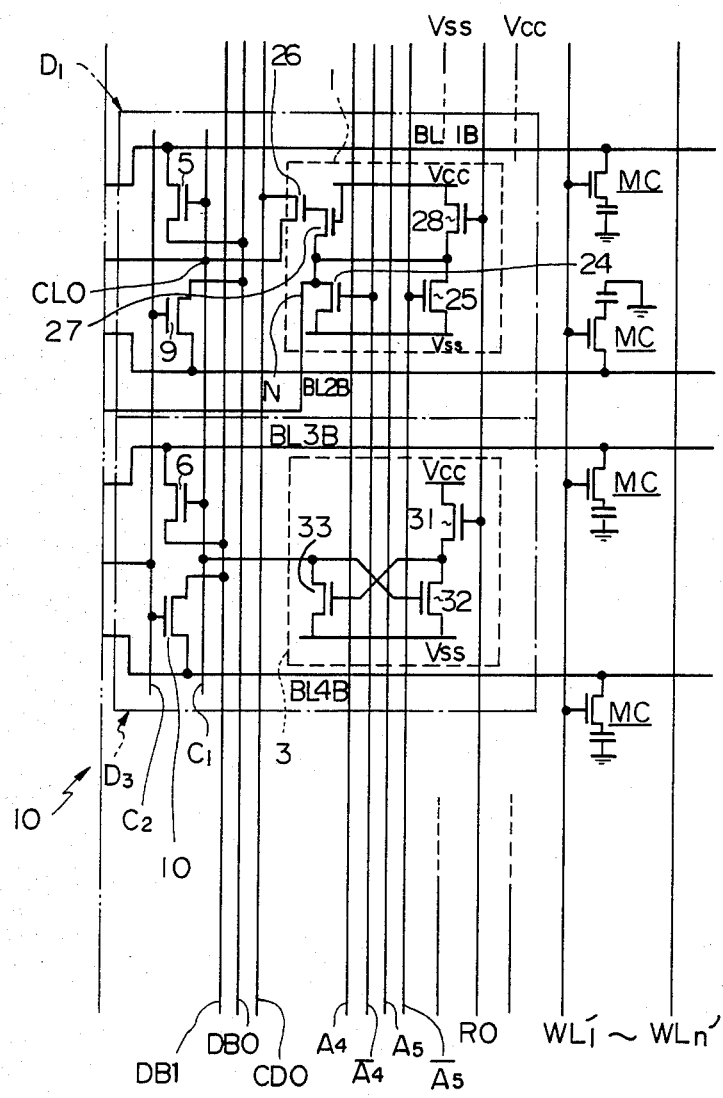

FIG. 3 is a diagram of the circuit structure which is schematically shown in FIG. 2. In FIG. 3, the parts which are the same as those in FIG. 2 are designated by the same reference symbols as those in FIG. 2. Therefore, an explanation thereof is omitted here.

As illustrated in FIG. 3, the column decoder 10 is divided into four circuit sections, one section being formed in each of the four circuit blocks D1, D2, D3, and D4. Decoding portions 1 and 2 of the column decoder 10 are disposed in the circuit blocks D1 and D2, respectively. The decoding portions 1 and 2 comprise MIS transistors 24 through 28 and 20 through 23, respectively. The transistors 22 through 25 and 28 constitute a NOR gate to which column address signals, for example, $\overline{A2}$, A3, $\overline{A4}$, and $\overline{A5}$, are supplied. A clamping portion 3 of the column decoder 10 formed in the circuit block D3 comprises a MIS transistor 31 and cross-coupled MIS transistors 32 and 33. Another clamping portion 4 of the column decoder 10 formed in the circuit block D4 comprises a MIS transistor 34 and cross-coupled MIS transistors 35 and 36. The clamping portion 3 is used for clamping the output signal from the decoding portion 1, i.e., the signal on a bypass line CL0 connected to the common internal line C1. The clamping portion 4 is used for clamping the output signal from the decoding portion 2, i.e., the signal on a bypass line CL1 connected to the common internal line C2.

The signal on the line CL0, which becomes high when the column-selecting signal CD0 is high and the transistor 26 is in a turned on state, is supplied to the gate electrodes of the transfer gate elements, i.e., MIS transistors 5, 6, 7, and 8 disposed in the circuit blocks D1, D3, D2, and D4, respectively, through the common internal line C1. The signal on the line CL1, which becomes high when the column-selecting signal CD1 is high and the transistor 20 is turned on, is also supplied to the gate electrodes of the transfer gate elements, i.e., MIS transistors 9, 10, 11 and 12 disposed in the circuit blocks D1, D3, D2, and D4, respectively, through the common internal line C2.

Operation of the circuit, according to the present invention, having the above-mentioned structure, will now be explained. When the column address signals are supplied to the decoding portions 1 and 2 so that the potential of a node N, i.e., the potential of the output of the NOR gate in the decoding portions 1 and 2, becomes high, i.e., when the column decoder 10 is selected, the transistors 26 and 20 are both turned on. In this condition, if the column-selecting signal CD0, which is, for example, the column address signal A0, is high, the output signal on the line CL0 becomes high. Therefore, the transfer gate elements 5, 6, 7, and 8 are turned on. At this time, if energization of a selected word line and operation of the sense amplifiers SA21 and SA23, corresponding to the transfer gate elements 5, 7 and 6, 8, respectively, are performed and the readout signals from selected memory cells are generated onto the bit lines BL1A, BL1B and BL3A, BL3B. The signals on the bit lines BL1A and BL1B are transferred to the data buses $\overline{DB0}$ and DB0 through the transfer gate elements 7 and 5, respectively, and the signals on the bit lines BL3A and BL3B are transferred to the data buses $\overline{DB1}$ and DB1 through the transfer gate elements 8 and 6, respectively.

In the above-mentioned condition, if the column-selecting signal CD1, which is, for example, the column address signal $\overline{A0}$ and is complementary to the signal CD0, is high, the output signal on the line CL1 becomes high. Therefore, the transfer gate elements 9, 11, 10 and 12 are turned on. At this time, if energization of a selected word line and operation of the sense amplifiers SA22 and SA24, corresponding to the gate elements 9, 11 and 10, 12, respectively, are performed and the readout signals from selected memory cells are generated onto the bit lines BL2A, BL2B and BL4A, BL4B, the signals on the bit lines BL2A and BL2B are transferred to the data buses $\overline{DB0}$ and DB0 through the transfer gate elements 11 and 9, respectively, and the signals on the bit lines BL4A and BL4B are transferred to the data buses $\overline{DB1}$ and DB1 through the transfer gate elements 12 and 10, respectively.

In the above-mentioned embodiment, the signals transferred to the data buses DB0, $\overline{DB0}$ and DB1, $\overline{DB1}$ are simultaneously output as a two-bit readout signal through an output buffer circuit (not shown in FIG. 3). However, it is also possible to output only a one-bit readout signal corresponding to the data bus pair $\overline{DB0}$ and DB0 or the data bus pair $\overline{DB1}$ and DB1. The selection of a one-bit output signal is performed, for example, in an output buffer circuit by the column address signals $\overline{A1}$ and A1. In such a case, the output buffer comprises a first buffer amplifier which is activated by the column address signal $\overline{A1}$ and to which the signals from the bit line pair $\overline{DB0}$ and DB0 are supplied, a second buffer amplifier which is activated by the column address signal A1 and to which the signals from the bit line pair $\overline{DB1}$ and DB1 are supplied, and an OR gate which receives the output signals from the first and second buffer amplifiers.

As mentioned above, in the circuit of FIGS. 2 and 3, it is possible to select one of the sense amplifiers SA21, SA22, SA23 and SA24, by using a single column decoder 10, and it is not necessary to change the structure of the column decoder 10. Therefore, the area occupied by the column decoders on a semiconductor substrate of a memory device according to the present invention is half that of a conventional memory device in which one of two sense amplifiers is selected by a single column decoder. In the memory device according to the present invention, since all the circuit elements necessary for the column decoders are formed in a reduced area, it is possible to use the otherwise occupied area for the formation of other circuits, such as other decoder circuits or memory cells. Therefore, it is possible to increase the degree of integration of the memory device.

Figure 4A:
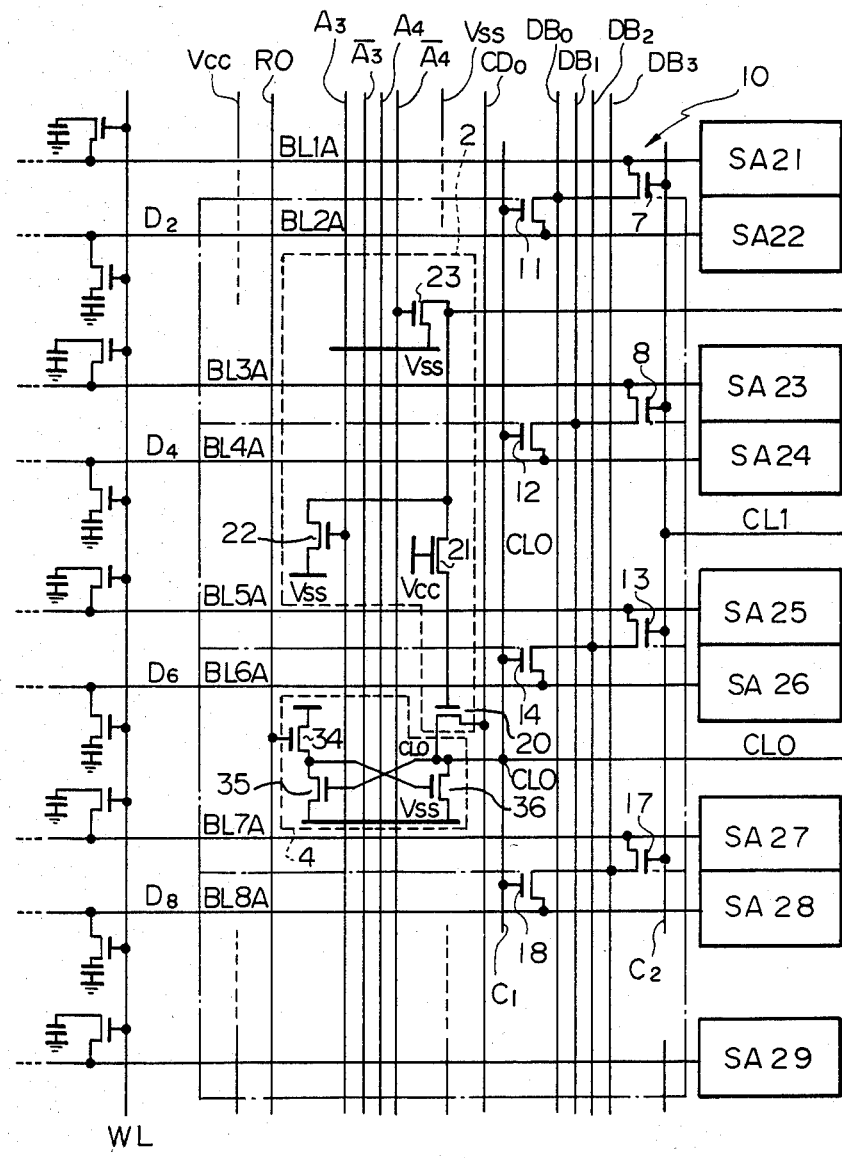
FIG. 4 which is comprised of FIGS. 4A and 4B is a block circuit diagram of a circuit of a semiconductor memory device in accordance with another embodiment of the present invention.
Figure 4B:
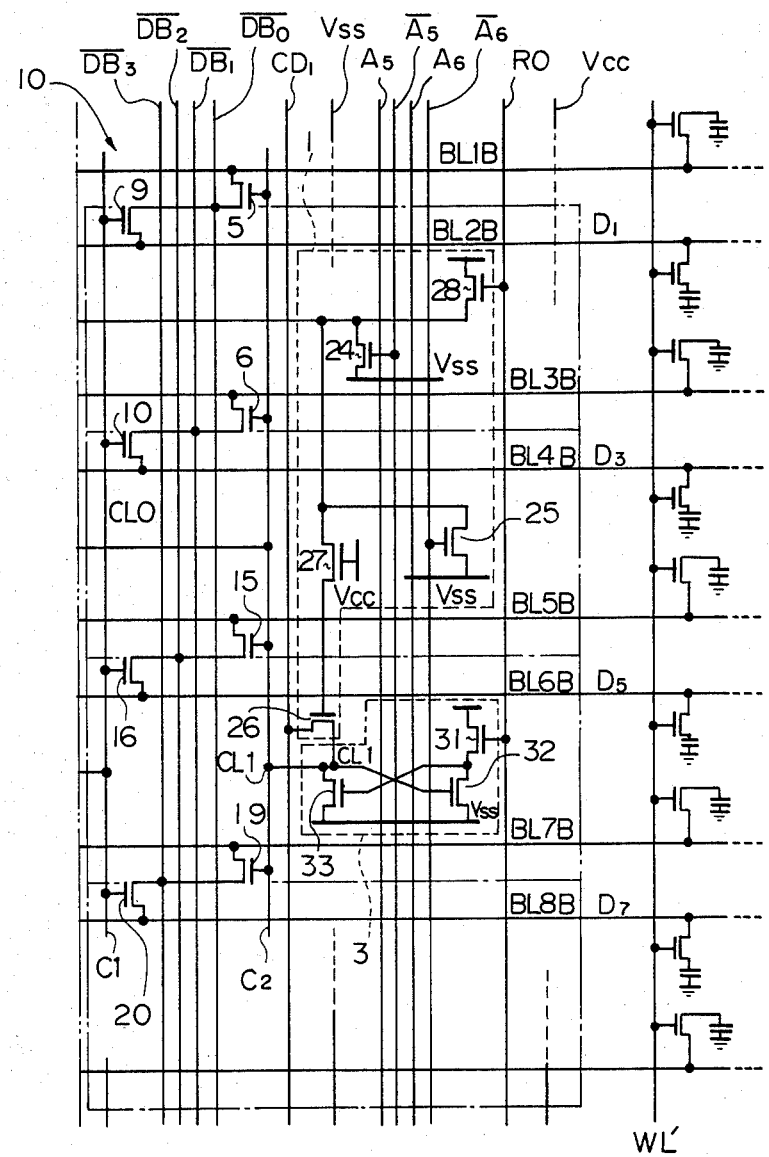

FIG. 4 is a detailed circuit diagram of a second embodiment of the present invention. The circuit of FIG. 4 differs from the circuit of FIG. 3 in that in the circuit of FIG. 4, a single column decoder is provided for eight sense amplifiers SA 21, SA 22, . . . , SA 28. The circuit of FIG. 4 also differs from the circuit of FIG. 3 in that it comprises eight data buses DB0, $\overline{DB0}$, DB1, $\overline{DB1}$, DB2, $\overline{DB2}$, DB3, and $\overline{DB3}$ instead of four data buses and eight sense amplifiers SA 21, SA 22, . . . , SA 23 for each column decoder 10 instead of four sense amplifiers. The eight sense amplifiers SA 21, SA 22, . . . , SA 28 are connected to pairs of bit lines BL1A and BL1B, BL2A and BL2B, . . . , BL8A and BL8B, respectively. Between the bit lines BL5A and BL6A and the data bus $\overline{DB2}$, gate elements 13 and 14 are connected, respectively. Between the bit lines BL5B and BL6B and the data bus DB2, gate elements 15 and 16 are connected, respectively. Between the bit lines BL7A and BL8A and the data bus DB3, gate elements 17 and 18 are connected. Between the bit lines BL7B and BL8B and the data bus $\overline{DB3}$, gate element 19 and 20 are connected. Between the bit lines BL1A and BL2A and the data bus DB0, between the bit lines BL1B and BL2B and the data bus $\overline{DB0}$, between the bit lines BL3A and BL4A and the data bus DB1, and between the bit lines BL3B and BL4B and the data bus $\overline{DB1}$, the gate elements 7 and 11, 5 and 9, 8 and 12, and 6 and 10 are connected, respectively, in a manner similar to that of the circuit of FIG. 3. The column decoder 10 is divided into six circuit sections, one section being formed in each of the six circuit blocks D1, D2, . . . , D6. A decoding portion 1 is divided into two circuit sections formed in the adjacent circuit blocks D1 and D3, and another decoding portion 2 is divided into two circuit sections formed in the adjacent circuit blocks D2 and D4. A clamping portion 3 is formed in the circuit block D5 and another clamping portion 4 is formed in the circuit block D6. Two more circuit blocks D7 and D8 are used for forming other circuit elements, such as capacitors, for stabilizing the power supply voltage. The other parts of FIG. 4 are the same as those of FIG. 3 and are designated by the same reference numbers and symbols as those in FIG. 3. Therefore, an explanation is omitted here.

Operation of the circuit of FIG. 4 is briefly described below. When the decoding portion 1 is selected and the output signal CL1 becomes high, the sense amplifiers SA 21, SA 23, SA 25 and SA 27 are selected and the signals on the bit lines BL1A, BL1B, BL3A, BL3B, BL5A, BL5B, BL7A, and BL7B are transferred to the data buses DB0, $\overline{DB0}$, DB1, $\overline{DB1}$, DB2, $\overline{DB2}$, DB3 and $\overline{DB3}$ through the gate elements 7, 5, 8, 6, 13, 15, 17 and 19, respectively. When the decoding portion 2 is selected and the output signal CL0 thereof becomes high, the sense amplifiers SA 22, SA 24, SA 26 and SA 28 are selected and the signals on the bit lines BL2A, BL2B, BL4A, BL4B, BL6A, BL6B, BL8A and BL8B are transferred to the data buses DB0, $\overline{DB0}$, DB1, $\overline{DB1}$, DB2, $\overline{DB2}$, DB3 and $\overline{DB3}$ through the gate elements 11, 9, 12, 10, 14, 16, 18 and 20, respectively.

The signals transferred to the data buses DB0, $\overline{DB0}$, DB1, . . . , $\overline{DB3}$ are supplied to an output buffer circuit (not shown) and are output therefrom as four bit readout signals. It is also possible to output a one bit readout signal from the output buffer circuit. In such a case, one of four bit signals is selected, depending on the column address signals, for example, A1 (or $\overline{A1}$) and A2 (or $\overline{A2}$), by gate circuits formed, for example, in the output buffer circuit.

As mentioned above, in the circuit of FIG. 4 it is possible to select one or more sense amplifiers from eight sense amplifiers with one column decoder 10, and therefore the area occupied on a semiconductor substrate by the column decoder 10 is very small. As a result, the column decoder 10 can be disposed in the circuit blocks D1, D2, D3, D4, D5 and D6 and the circuit blocks D7 and D8 can be used for forming other peripheral circuits, such as capacitors for stabilizing the power supply voltage and so on.

In the above-mentioned embodiments of FIGS. 2 through 4, since the number of column decoders is small and each column decoder is divided into a plurality of circuit sections disposed on both sides of the sense amplifier array, the pitch length 1 of FIG. 2, i.e., the width of the column decoder area, is reduced. Therefore, the increased area on the semiconductor substrate due to a decrease in the pitch length 1 can be used for forming, for example, memory cells, and the degree of integration of the memory device can further be increased.

We claim:

1. A semiconductor memory device, having a semiconductor substrate and operatively connected to receive column address signals, comprising:
    a plurality of sense amplifiers divided into sense amplifier groups, for providing output signals;
    bit lines, operatively connected to said sense amplifiers and arrayed on the semiconductor substrate, each of said sense amplifiers being connected to a pair of said bit lines;
    column decoders, operatively connected to receive the column address signals and, respectively, operatively connected to said sense amplifier groups, for selecting said sense amplifier groups;
    one or more control signal lines, operatively connected to said sense amplifiers, for simultaneously selecting the output signals of at least two sense amplifiers in said sense amplifier group selected by said column decoders; and a plurality of data buses, operatively connected to said bit lines, for transferring the output signals of at least two said sense amplifiers selected by said one or more control signal lines, to said bit lines, said sense amplifiers having said control signal lines and said data buses in common.

2. A semiconductor memory device according to claim 1, wherein said control signal lines are operatively connected to receive control signals generated by a portion of the column addrress signals supplied to said semiconductor memory device.

3. A semiconductor memory device according to claim 1, wherein each of said plurality of sense amplifiers has first and second sides and wherein said control signal lines comprise first and second control signal lines, said first control signal line being disposed on the first side of said plurality of sense amplifiers and said second control signal line being disposed on the second side of said plurality of sense amplifiers.

4. A semiconductor memory device according to claim 1, wherein each of said column decoders comprises:

a decoding portion for decoding the column address signals supplied thereto; and first and second clamping portions operatively connected to said decoding portion.

5. A semiconductor memory device according to claim 4, wherein said decoding portion is divided into first and second circuit sections, said first circuit section being disposed on the first side of said plurality of sense amplifiers and said second circuit section being disposed on the second side of said plurality of sense amplifiers.

6. A semiconductor memory device according to claim 4 or 5, wherein said first clamping portion is disposed on the first side of said plurality of sense amplifiers and said second clamping portion is disposed on the second side of said plurality of sense amplifiers.

7. A semiconductor memory device according to claim 4, wherein said decoding portion comprises:

a decoding gate operatively connected to receive the column address signals and provide an output signal; and transfer gates operatively connected to receive the output signal from said decoding gate.

8. A semiconductor memory device according to claim 7, wherein said decoding gate is a NOR gate comprising a plurality of inverter transistors having gate electrodes operative connected to receive the column address signals and operatively connected in parallel to each other.

9. A semiconductor memory device according to claim 4, wherein said first and second clamping portions each comprise transistors which are cross-coupled at their respective gates and drains.

10. A semiconductor memory device according to claim 7, further comprising gate elements each having a control gate, operatively connected between said bit lines and said data buses, wherein the control signals supplied to said control signal lines are transferred to said first and second clamping portions and output signals from said first and second clamping portions are supplied to said control gate of said gate elements.

11. A semiconductor memory device according to claim 10, further comprising common internal lines disposed on the first and second sides of said plurality of sense amplifiers and operatively connected to said clamping portions and said control gate, wherein the output signals from said clamping portions are supplied to said common internal lines.

12. A semiconductor memory device according to claim 10, further comprising bypass lines operatively connected to said clamping portions and said control gate and disposed between each of said plurality of sense amplifiers, wherein the output signals from said clamping portions are supplied to said bypass lines.

13. A semiconductor memory device according to claim 1, wherein each of said plurality of sense amplifiers has first and second sides and wherein said semiconductor memory device comprises four data buses, a first and second one of said four data buses being disposed on the first side of said plurality of sense amplifiers and a third and fourth one of said four data buses being disposed on the second side of said plurality of sense amplifiers, and wherein each of said plurality of sense amplifier groups comprises four sense amplifiers.

14. A semiconductor memory device according to claim 1, wherein each of said plurality of sense amplifiers has first and second sides and wherein said semiconductor memory device comprises eight data buses, four of said data buses being disposed on the first side of said plurality of sense amplifiers and the remaining four of said data buses being disposed on the second side of said plurality of sense amplifiers, and wherein each of said sense amplifier groups comprises eight sense amplifiers.

* * * * *

UNITED STATES PATENT AND TRADEMARK OFFICE
CERTIFICATE OF CORRECTION

PATENT NO. : 4,511,997
DATED : APRIL 16, 1985
INVENTOR(S) : SHIGEKI NOZAKI ET AL.

It is certified that error appears in the above-identified patent and that said Letters Patent is hereby corrected as shown below:

Col. 2, line 54, "if" (second occurrence) should be --is--.

Col. 3, line 24, "amplifier" should be --amplifiers--;
line 37, before "parallel" insert --and are--;
line 45, "W'" should be --WL'--;
line 65, "A3" should be --$\overline{A3}$--.

Col. 4, line 65, "DB0" (first occurrence) should be --$\overline{DB0}$--;
"DB1" (first occurrence) should be --$\overline{DB1}$--.

Col. 5, line 47, "DB2" should be --$\overline{DB2}$--;
line 51, "element" should be --elements--.

Col. 8, line 1, "operative" should be --operatively--.

Signed and Sealed this

Seventeenth Day of September 1985

[SEAL]

Attest:

DONALD J. QUIGG

Attesting Officer

Commissioner of Patents and
Trademarks—Designate